(12) United States Patent
Kawamura et al.

(10) Patent No.: US 10,670,659 B2
(45) Date of Patent: Jun. 2, 2020

(54) DEVICE AND METHOD FOR ESTIMATING BATTERY STATE

(71) Applicant: HONDA MOTOR CO., LTD., Tokyo (JP)

(72) Inventors: Masayuki Kawamura, Wako (JP); Tetsuaki Nakano, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 472 days.

(21) Appl. No.: 15/622,458

(22) Filed: Jun. 14, 2017

(65) Prior Publication Data

US 2017/0363690 A1 Dec. 21, 2017

(30) Foreign Application Priority Data

Jun. 15, 2016 (JP) ................................ 2016-118855

(51) Int. Cl.
*G01R 31/36* (2020.01)
*G01R 31/382* (2019.01)
*H01M 10/42* (2006.01)
*H01M 10/48* (2006.01)
*G01R 31/367* (2019.01)
*G01R 31/3842* (2019.01)
(Continued)

(52) U.S. Cl.
CPC ....... *G01R 31/3648* (2013.01); *G01R 31/367* (2019.01); *G01R 31/382* (2019.01); *G01R 31/3842* (2019.01); *H01M 10/425* (2013.01); *H01M 10/48* (2013.01); *H01M 10/486* (2013.01); *G01R 31/3828* (2019.01); *G01R 31/3835* (2019.01)

(58) Field of Classification Search
CPC .................................................. G01R 31/3648
See application file for complete search history.

(56) References Cited

U.S. PATENT DOCUMENTS

2010/0131217 A1* 5/2010 Ichikawa ........... G01R 31/3648
702/63
2015/0357852 A1 12/2015 Nakao et al.
2018/0074129 A1* 3/2018 Nakao ....................... B60L 3/00

FOREIGN PATENT DOCUMENTS

| CN | 101687465 A | 3/2010 |
|---|---|---|
| JP | 2014-196985 A | 10/2014 |
| JP | 2015-230193 A | 12/2015 |

OTHER PUBLICATIONS

Chinese Office Action with English translation dated May 15, 2019 (10 pages).

* cited by examiner

*Primary Examiner* — Manuel A Rivera Vargas
(74) *Attorney, Agent, or Firm* — Rankin, Hill & Clark LLP

(57) ABSTRACT

A battery-state estimating device for accurately estimating a battery state of a battery includes: an OCV calculating unit calculating an OCV from the detected values; a charge state estimating unit deriving charge state parameters on the basis of the calculated OCV and an Ah (integrated current value)-OCV map; a map adjusting unit adjusting the Ah-OCV map, wherein the map adjusting unit derives a model equation of the Ah-OCV map on the basis of a first OCV at a first time-point and a second OCV at a second time-point calculated by the OCV calculating unit, and the difference between the integrated current values, wherein the difference has been generated by current flowing through the secondary battery 1 during the first time-point and the second time-point; and adjusts the Ah-OCV map using the model equation.

5 Claims, 10 Drawing Sheets

(51) Int. Cl.
*G01R 31/3835* (2019.01)
*G01R 31/3828* (2019.01)

DEVICE AND METHOD FOR ESTIMATING BATTERY STATE

CROSS-REFERENCE TO RELATED APPLICATIONS

The present application relates to and claims priority from Japanese patent application No. 2016-118855, filed on Jun. 15, 2016, whose entirety of the contents and subject matter is incorporated herein by reference.

BACKGROUND OF THE INVENTION

(1) Field of the Invention

The present invention relates to a device and method for estimating a battery state.

(2) Description of the Related Art

An electric vehicle such as an EV (Electric Vehicle) or a HEV (Hybrid Electric Vehicle) requires an accurate estimation of a battery state for appropriately controlling a battery. Important parameters of the battery state include a state-of-charge (SOC). It is known that the SOC has a relationship with an open circuit voltage (OCV) in a high-voltage battery such as Li-ion battery that is used for the electric vehicle. Therefore, one way for estimating the SOC is firstly estimating an OCV and secondly converting the OCV to the SOC on a basis of the above-mentioned relationship of the SOC with the OCV (hereinafter, SOC-OCV curve).

The SOC-OCV curve varies due to factors such as a deterioration state and an individual difference of the battery. Therefore, in a conventional technique of the art, an optimum SOC-OCV curve has been selected on the basis of obtained data from a map that stores various SOC-OCV curves varying due to deteriorated states, individual differences, and temperature. This conventional technique commonly needs to obtain the SOC-OCV curves in ideal states of devices such as a rechargeable device in order to configure vehicle data in advance. However, the method described above is incapable of dealing with a variation of the SOC-OCV curve due to mass production and a change of the SOC-OCV curve due to deterioration, leading to deterioration of preciseness in the SOC estimation.

Patent Document 1 (see the below section of "Related Patent Literature") describes a battery control device that has an SOC-OCV map-data storage unit that stores SOC-OCV map data describing a correspondence of a battery open circuit voltage with a state-of-charge of a battery; updates the correspondence described by the SOC-OCV map data based on the battery open circuit voltage and current flowing through the battery; and thereby outputs a state-of-charge with values varying with time elapsing.

Patent Document 2 (see below) describes a deterioration state estimating device including a Q calculating unit receiving a voltage, current, and a battery temperature of a secondary battery to calculate a discharge capacitance; an OCV calculating unit for calculating an OCV (open circuit voltage) value; and an OCV curve estimating unit for estimating at least one OCV curve.

(3) Related Art Literature

(a) Related Patent Literature

Patent Literature 1: Japan Unexamined Patent Publication No. 2014-196985

Patent Literature 2: Japan Unexamined Patent Publication No. 2015-230193

BRIEF SUMMARY OF THE INVENTION

However, the battery control device described in Patent Document 1 stores a map of the SOC-OCV curves based on the deterioration state, the individual difference, and the temperature; and therefore, all of combinations of the above factors becomes huge. This results in an actually very difficult problem. Implementation of such a huge map of the SOC-OCV curves would need enormous storage capacity to store such a huge map, resulting in very high cost. And, reduction of the map to reduce the storage capacity causes deterioration of preciseness. Further, search cannot be done for a map except a prepared one.

Patent Document 2 describes a technique that estimates the SOC-OCV curve by utilizing a hysteresis characteristic of the SOC-OCV curve, and therefore, the technique cannot perform estimation itself if the SOC-OCV curve has no hysteresis or only small hysteresis. In addition, Patent Document 2 describes nothing of the deterioration state and the individual difference when describing an estimation of another SOC-OCV curve from a SOC-OCV curve. Further, Patent Document 2 takes an assumption that a battery capacity could determine a unique SOC-OCV curve, but this assumption is actually wrong. In addition, Patent Document 2 has a description that its technique is not supposed to be implemented in a vehicle.

In view of the above problem of the conventional art, an object of the present invention is to provide a device and method for estimating the battery state that are able to perform a precise estimation of the battery state.

SUMMARY OF THE INVENTION

In order to solve the above problems, a device for estimating a battery state according to a first aspect of the present invention includes:

a current detecting unit configured to detect a charge/discharge current of a battery;

a voltage detecting unit configured to detect an inter-terminal voltage of the battery;

an OCV calculating unit configured to calculate an OCV (Open Circuit Voltage) on a basis of the charge/discharge current detected and the inter-terminal voltage detected of the battery and an internal resistance at times of charge and discharge;

a charge state estimating unit configured to derive a charge state parameter on a basis of the OCV calculated and a charge state parameter-OCV map;

and a map adjusting unit configured to adjust the charge state parameter-OCV map, wherein the map adjusting unit is configured to:

derive a model equation for the charge state parameter-OCV map on a basis of a first OCV calculated by the OCV calculating unit at a first time-point, a second OCV calculated by the OCV calculating unit at a second time-point, and a difference between integrated current values generated by current flowing through the battery during the first time-point and the second time-point; and adjust the charge state parameter-OCV map using the model equation derived.

In addition, a method for estimating a battery state according to a second aspect of the present invention includes:

a current detecting step of detecting a charge/discharge current of a battery;

a voltage detecting step of detecting an inter-terminal voltage of the battery;

an OCV calculating step of calculating an OCV (Open Circuit Voltage) on a basis of the charge/discharge current detected and the inter-terminal voltage of the battery detected and an internal resistance at a time of charge and discharge;

a charge state estimating step of deriving a charge state parameter on a basis of the OCV calculated and a charge state parameter-OCV map;

and a map adjusting step of adjusting the charge state parameter-OCV map, wherein the map adjusting step includes:

deriving a model equation for the charge state parameter-OCV map on a basis of a first OCV calculated by the OCV calculating step at a first time-point, a second OCV calculated by the OCV calculating step at a second time-point, and a difference between integrated current values generated by current flowing through the battery during the first time-point and the second time-point; and adjusting the charge state parameter-OCV map using the model equation.

Thereby, even if there occurs a change of the SOC-OCV curve due to a production variation and deterioration, calculations of the SOC and capacitance are able to be performed in consideration of the change of the SOC-OCV curve, which enables using up more inherent capability of the battery. There are two ways to utilize the above advantage of the present invention: firstly, vehicle performance can be improved by a quantity corresponding to improved estimation preciseness of the state-of-charge of the battery; secondly, a cost can be lowered by the quantity corresponding to the improved estimation preciseness, for example, by reducing the number of cells.

According to a third aspect of the present invention, the map adjusting unit is configured to:

include a storage unit configured to store one or more combinations of the first OCV, the second OCV, and the difference between the integrated current values and retrieve the one or more combinations of the first OCV, the second OCV, and the difference between the integrated current values to adjust the charge state parameter-OCV map.

The above-described configuration enables adjusting the charge state parameter-OCV map with a high preciseness while reducing a storage capacity by adjusting the map in a state of storing the one or more combinations of the first OCV, the second OCV, and the difference between the integrated current values.

According to a fourth aspect of the present invention, the map adjusting unit:

includes a gradient deriving unit configured to derive a gradient indicating a variation of the OCV with respect to the charge state parameter as a gradient value, pre-determines a value range over which the gradient may take, and adjusts the model equation when the gradient is out of the value range pre-determined.

The above-described configuration enables a precise estimation of the state-of-charge of the battery by preliminarily limiting the range of the gradient value on the basis of specifications of the battery to adjust the model equation that is out of the limited range of the gradient value using the map adjusting unit.

According to a fifth aspect of the present invention, the gradient deriving unit changes the range over which the gradient value can take, in accordance to a deterioration state of the battery.

The above-described configuration enables a more precise estimation of the state-of-charge of the battery by changing the value range over which the gradient can take, according to the deterioration state of the battery. The reason of which is described as follows: learning of the SOC-OCV curve is low in the estimation preciseness in a case of using a method setting no limitation on the gradient and coefficients of an approximate equation. The present invention is able to highly improve the estimation preciseness of the state-of-charge of the battery by limiting the gradient of the SOC-OCV curve and the coefficients of the approximate equation for automatic learning of the SOC-OCV curve using the SOC and the OCV calculated by a controller.

Further, according to a sixth aspect of the invention, the device for estimating a battery state further includes a battery temperature detecting unit configured to detect a temperature of the battery, wherein the map adjusting unit adjusts the charge state parameter-OCV map for each detected temperature of the battery.

The above-described configuration enables a more precise estimation of the state-of-charge of the battery by enabling calculation of the SOC and the capacitance corresponding to each temperature of the battery.

Effect of the Invention

The present invention provides a device and method for estimating a battery state that is able to more accurately estimate the battery state.

BRIEF DESCRIPTION OF THE DRAWINGS

FIG. 11A is a graph showing a relationship between a cost function J and the parameter $\theta$; and FIG. 11B is a graph showing a relationship between the parameter $\theta$ and a partial differential ($\partial J/\partial\theta$) of the cost function J with respect to $\theta$.

DETAILED DESCRIPTION OF THE INVENTION

Now, an embodiment of the present invention is described in detail with reference to the drawings.

Embodiment

Figure 1:
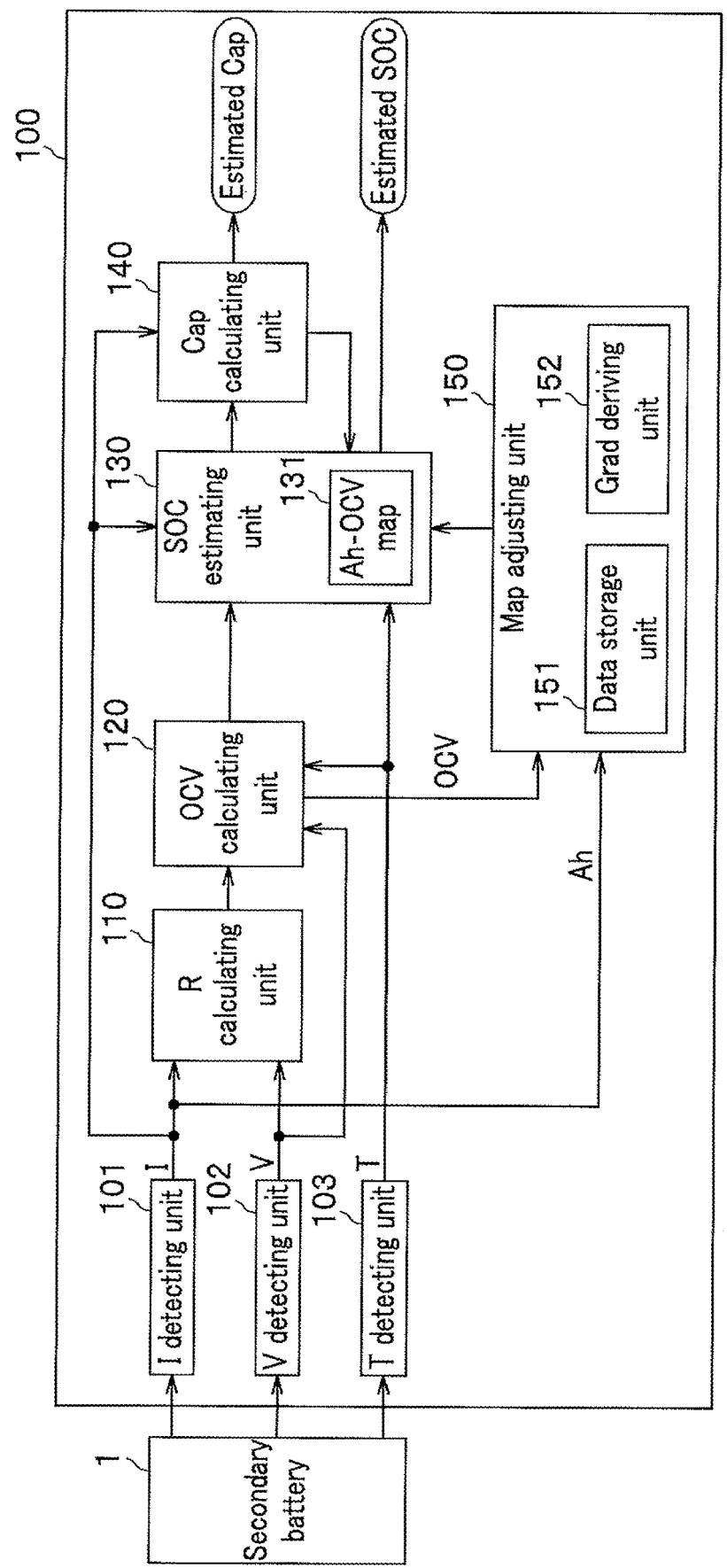
FIG. 1 is a diagram showing a configuration of a battery-state estimating device according to an embodiment of the present invention.

FIG. 1 is a diagram showing a configuration of a battery-state estimating device according to an embodiment of the present invention. The battery-state estimating device of the present embodiment is mounted on, for example, a vehicle such as an EV or an HEV together with a secondary battery whose battery state is estimated by the battery-state estimating device. Such a battery-state estimating device mounted on the vehicle works as a battery ECU (Electric Control Unit).

As shown in FIG. 1, the battery-state estimating device 100 includes a current detecting unit 101, a voltage detecting unit 102, a temperature detecting unit 103, a resistance calculating unit 110, an OCV calculating unit 120, a charge state estimating unit 130, an Ah-OCV (charge state parameter—OCV) map 131, a capacitance calculating unit 140, and a map adjusting unit 150.

The map adjusting unit 150 includes a data storage unit 151 and a gradient deriving unit 152.

<Detecting Units>

The current detecting unit 101 detects "I": at least either one of a charge current charged to and a discharge current discharged from the secondary battery 1 (hereinafter also referred to as charge/discharge current).

The voltage detecting unit 102 detects an inter-terminal voltage V of the secondary battery 1.

The temperature detecting unit 103 detects a temperature T of the secondary battery 1.

<Resistance Calculating Unit>

The resistance calculating unit 110 calculates a resistance R from the detected current and inter-terminal voltage of the secondary battery 1.

In detail, the resistance calculating unit 110 calculates the resistance R on the basis of a differential value of the current detected by the current detecting unit 101 dI (hereinafter also referred to as an "actual current") and a differential value of the voltage detected by the voltage detecting unit 102 dV (hereinafter also referred to as "actual voltage"), according to the following equation (1). A method of calculating the resistance is specifically described below with reference to FIG. 3.

$$R = dV/dI \quad (1)$$

Figure 3:
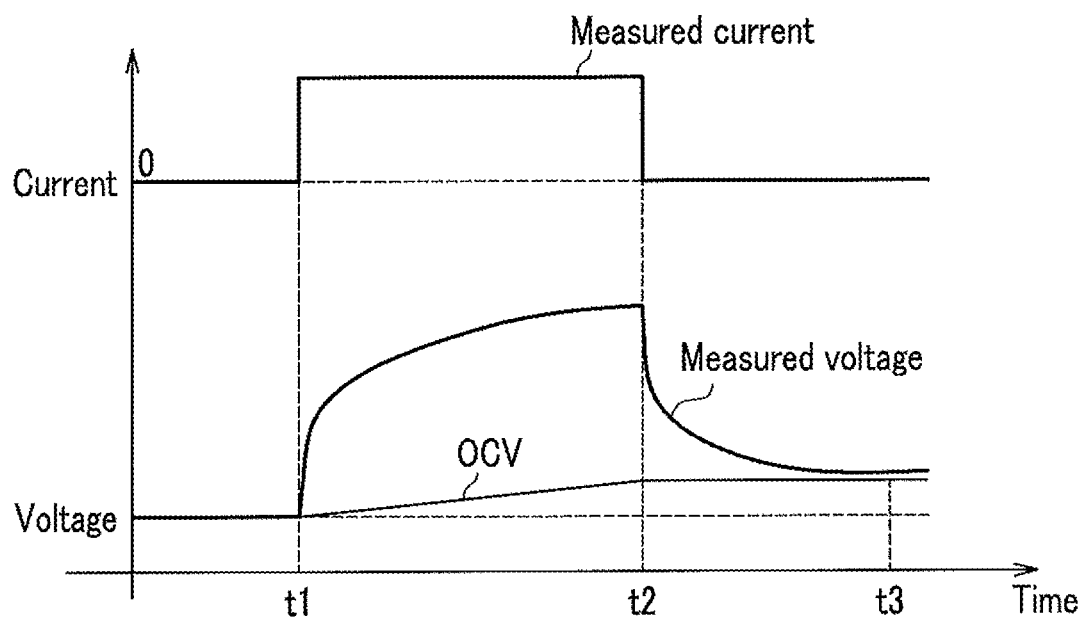
FIG. 3 is a graph showing a measured value of a charge/discharge current and a measured value of a voltage of a secondary battery when current is applied into the secondary battery.
Figure 4:
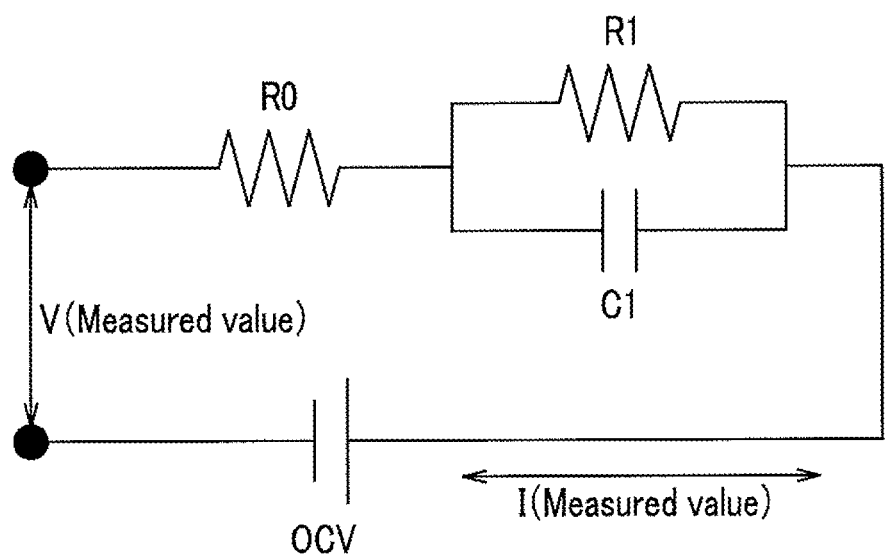
FIG. 4 is a diagram showing an equivalent circuit model of the secondary battery of FIG. 3.

FIG. 3 is a graph showing measured values of the charge/discharge current and the voltage of the secondary battery when current is applied to the secondary battery; and FIG. 4 is a diagram showing an equivalent circuit model of the secondary battery shown in FIG. 3 (For a capacitor component, only a primary component is shown).

Obtaining an internal resistance and the SOC from the measured values of the voltage and the current of the secondary battery assumes that the following relational equation (equation (2)) holds.

$$V \text{ (measured voltage value)} = \text{OCV (open circuit voltage)} - K \text{ (internal resistance)} \times I \text{ (measured current value)} \quad (2)$$

In order to obtain the internal resistance K, parameters including a parameter of the internal resistance are estimated using a first order equation of the equation (2) as a simplified model of the secondary battery. For an approximation approach of the first order equation, a sequential least square method is known, but this sequential least square method alone could not be able to accurately estimate the internal resistance value of the secondary battery.

The characteristic of the secondary battery is not wholly linear, but partly nonlinear as shown in FIG. 3. FIG. 3 shows measured values of the charge/discharge current and the voltage of the secondary battery when the current is applied to the secondary battery. FIG. 3 also shows that the current is started to be applied at a time t1 and then the voltage gradually rises later than the current; and that the application of the current is terminated at a time t2 and then the voltage gradually falls later than the current. The reason why the voltage fluctuates with a lag from the current is that the secondary battery includes a capacitance component as shown in FIG. 4 ("C component"; specifically a component C1 in FIG. 4). Actually, after the application of the current to the secondary battery is terminated, a primary delay and a secondary delay occur as delays of the voltage change.

An identifier (not shown) of the resistance calculating unit 110 estimates a gradient of the first order equation, that is, a virtual internal resistance: r, from the differential value dI of the actual current and the differential value dV of the actual voltage, using the sequential least square method. The above identifier identifies the parameters using the sequential least square method and outputs the identified parameters of the respective internal resistances at times of charging and discharging to the OCV calculating unit 120 (see FIG. 1).

Note that in the secondary battery shown in FIG. 3, there occurs so-called polarization. If the polarization occurs, an electrode potential when the current is flowing is different in value from that (equilibrium potential) when the current is not flowing. In a state of the polarization occurring in the secondary battery, a preciseness of the SOC estimation may be lowered due to a fluctuation in polarization level. Therefore, after confirming that the polarization of the secondary battery is eliminated, the SOC of the secondary battery is estimated. The polarization of the secondary battery is determined as being eliminated, for example, when a predetermined time has elapsed since an ignition key has been switched off.

<OCV Calculating Unit>

The OCV calculating unit 120 calculates the OCV (estimated OCV) from the detected values (the current I and the inter-terminal voltage CCV) and the calculated resistances (the internal resistances at the times of charging and discharging) according to the following equation (3).

$$OCV = CCV + IR \quad (3)$$

Specifically, the OCV calculating unit 120 monitors the detected current (actual current) and the voltage (actual voltage) and calculates the OCV (estimated OCV) on the basis of the internal resistances at the times of charging and discharging. Since the OCV (estimated OCV) is calculated using the equation of OCV=CCV+IR as shown in the equation (3), the estimation of the OCV does not need the SOC-OCV curve information.

<Charge State Estimating Unit>

The charge state estimating unit 130, when functioning as the SOC calculating unit, calculates the SOC (estimated SOC) from the OCV (estimated OCV) calculated by the OCV calculating unit 120 and the integrated current value, according to the following equation (4). The SOC (estimated SOC) is represented by a function of the temperature and the OCV (estimated OCV): $f_{SOC}$ as shown in the equation (5) below.

[Math. 1]

$$SOC = SOC_{ini} + \frac{\int_0^t I dt}{Cap} \quad (4)$$

$$SOC = f_{SOC}(T, OCV) \quad (5)$$

The charge state estimating unit 130 derives a charge state parameter (SOC or Ah) on the basis of the calculated OCV (estimated OCV) and the charge state parameter—OCV map (SOC- or Ah-OCV map) 131.

The present embodiment uses Ah (electric quantity, i.e., discharge capacitance) for the charge state parameter, but the SOC may be used. As described below, if capacitance (abbreviated as "Cap") is calculated by the capacitance calculating unit 140, a division of the Ah by the capacitance Cap mathematically becomes the SOC, and thus, either the SOC or the Ah may be used for the charge state parameter. That is, the Ah-OCV map 131 may be replaced by an SOC-OCV map.

<Ah-OCV Map>

Figure 2:
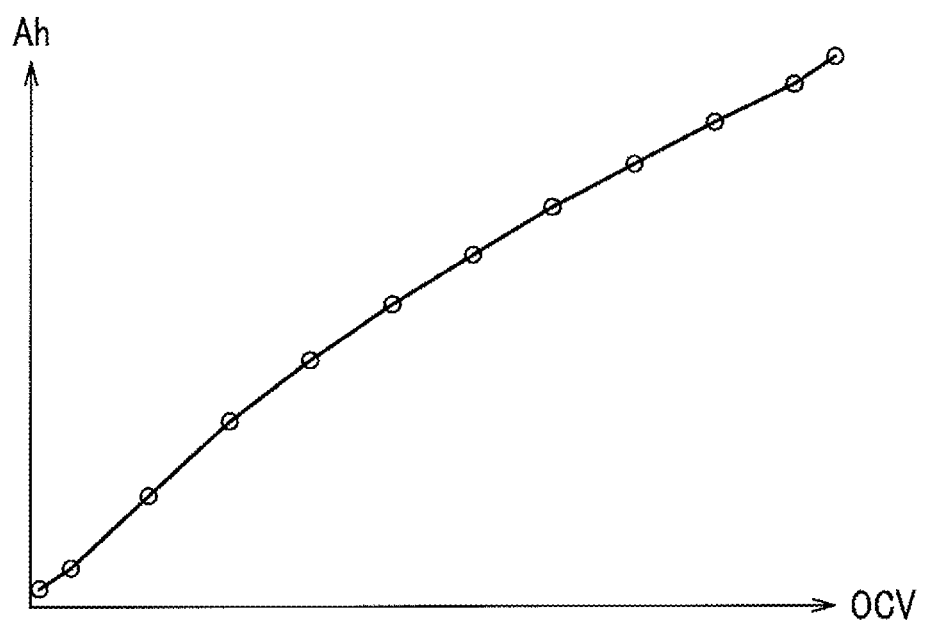
FIG. 2 is a graph showing a relation between electric quantity (hereinafter, Ah) and OCV stored in an Ah-OCV map of the battery-state estimating device according to the embodiment (hereinafter, Ah-OCV curve).

FIG. 2 is a graph showing the Ah-OCV curve (charge state parameter—OCV curve) stored in the Ah-OCV map 131. The Ah (electric quantity) is taken on the vertical axis in FIG. 2 and the OCV (estimated OCV) is taken on the horizontal axis.

The Ah-OCV map 131 is a map from which the charge state estimating unit 130 retrieves the charge state parameter—OCV curve. The Ah-OCV map 131 may be stored anywhere inside or outside of the charge state estimating unit 130 as long as it can be referenced by the charge state estimating unit 130. In the present embodiment, the Ah-OCV map 131 is disposed inside the charge state estimating unit 130.

<Capacitance Calculating Unit>

The capacitance calculating unit 140 calculates the capacitance, Cap from a differential value of the Ah: electric quantity (denoted as "dAh") and a differential value of the SOC: estimated SOC (denoted as "dSOC"), according to the following equation (6), and outputs the Cap to the charge state estimating unit 130. In the present specification, "dAh" represents a differential value and "ΔAh" a difference value. Both means a difference between values at two time-points, and "differential" contains concept such as minimizing the difference to a limit. In addition, dV and dI for calculating the resistance also represent differential values.

$$Cap = dAh/dSOC \quad (6)$$

<Map Adjusting Unit>

The map adjusting unit 150 adjusts the Ah-OCV map 131 (see FIG. 2).

Specifically, the map adjusting unit 150 derives a model equation of the Ah-OCV map 131 (See equation (8)) on the basis of a first OCV calculated by the OCV calculating unit 120 at a first time-point, a second OCV calculated by the OCV calculating unit 120 at a second time-point, and a difference between integrated current values generated by current flowing through the secondary battery 1 during the first time-point and the second time-point; and adjusts the Ah-OCV map 131 according to the model equation. That is, the map adjusting unit 150 derives a model equation based on the two OCVs obtained at a predetermined time interval (between the first time-point and the second time-point) and the difference between the integrated current values at the first and second time-points, and adjusts the Ah-OCV map 131.

The map adjusting unit 150 adjusts the Ah-OCV map 131 for each of temperatures of the secondary battery 1 (see FIG. 1) detected by the temperature detecting unit 103 (see FIG. 1)

The map adjusting unit 150 includes a data storage unit 151 and a gradient deriving unit 152.

The data storage unit 151 stores one or more sets (combinations) of the first OCV, the second OCV, and the difference between the integrated current values (see FIG. 6 below). The map adjusting unit 150 retrieves the first OCV, the second OCV, and the difference between the integrated current values from the data storage unit 151 as a set to adjust the Ah-OCV map 131.

The gradient deriving unit 152 derives a gradient indicating the OCV variation with respect to the charge state parameter (SOC or Ah) as the gradient value. As described below, the gradient value is equal to, for example, (dAh/dOCV). The map adjusting unit 150 preliminarily sets a range in which the gradient can take, and adjusts the model equation when the gradient is out of the range.

In addition, the gradient deriving unit 152 changes the range that the gradient can take (see FIG. 15 below) depending on the deterioration state of the secondary battery 1 (see FIG. 1).

Next is described an outline of a map adjusting method by the map adjusting unit 150.

<Training Set>

The map adjusting unit 150 shown in FIG. 1 acquires the Ah detected (electric quantity (discharge capacitance)) and the OCV (estimated OCV) calculated by the OCV calculating unit 120 as vehicle time-series data.

Figure 5:
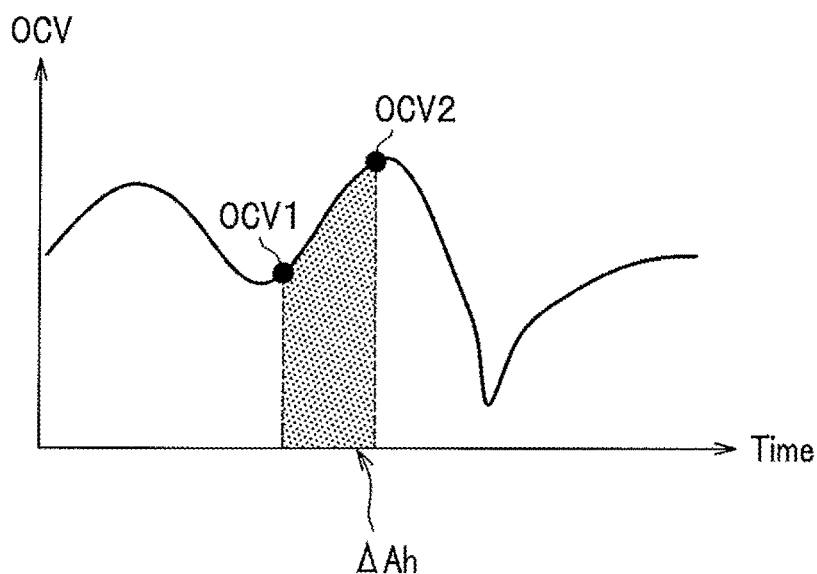
FIG. 5 is a graph showing an example of time-series data for a vehicle that is equipped with the battery-state estimating device according to the embodiment.

FIG. 5 is a diagram showing an example of time series data of a vehicle on which the battery-state estimating device 100 is mounted. FIG. 5 plots the OCV on the vertical axis and time on the horizontal axis. As shown in FIG. 5, the OCV value fluctuates with time, depending on the running condition of the vehicle and the like. Here, OCV values: OCV1 and OCV2 of arbitral two time-points are selected, and the difference between the integrated current values at the two time-points is assumed to be ΔAh. A data storage unit 151 of the map adjusting unit 150 stores a combination of the OCV values at the above two points: OCV1 and OCV2 and the difference ΔAh as a training set (learned data).

Figure 6:
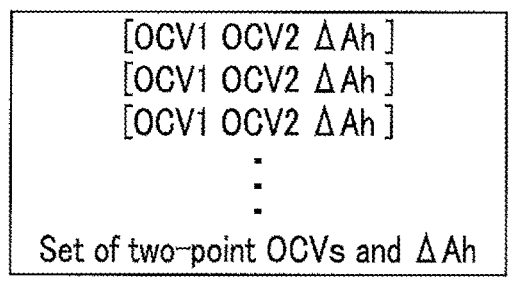
FIG. 6 is a diagram showing a training set acquired as the time-series data for the vehicle mounted with the battery-state estimating device according to the embodiment.

FIG. 6 is a diagram showing a training set acquired as the vehicle time series data. As shown in FIG. 6, the data storage unit 151 stores one or more sets of [OCV1, OCV2, ΔAh]: the OCV1 and OCV2 at two time-points and ΔAh (difference between integrated current values) at the two time-points.

<Supervised Learning>

Next, a supervised learning (learning under a supervisor) is described.

Figure 7:
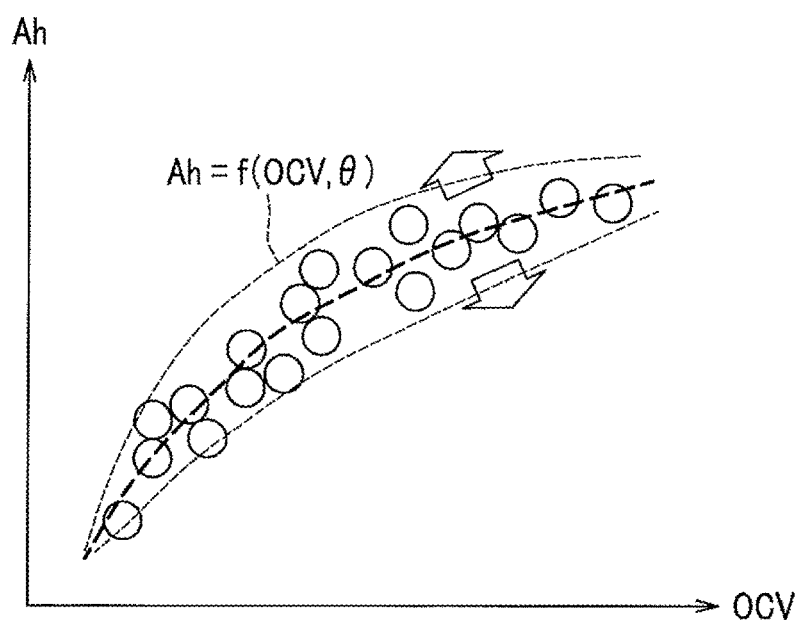
FIG. 7 is a graph showing an Ah-OCV curve illustrating a relation between an Ah (electric quantity) and the OCV (estimated OCV) in the battery-state estimating device according to the embodiment.

FIG. 7 is a diagram showing the Ah-OCV curve illustrating the correspondence between the Ah (electric quantity) and the OCV (estimated OCV). FIG. 7 plots the Ah (electric quantity) on the vertical axis, the OCV (estimated OCV) on the horizontal axis. A mark of circle (○) in FIG. 7 represents a sampled value.

As shown in FIG. 7, the Ah (electric quantity) can be expressed by a hypothetical function expressed by the following equation (7), which is described later.

$$Ah = f(OCV, \theta_j) \quad (7)$$

Here, $\theta_j$ is a parameter (vector).

The Ah (electric quantity) indicated by the thick broken line in FIG. 7 is obtained by an optimum value search. The optimum value search may use Gradient Descent method (steepest descent method), Gauss-Newton method, or Normal Equation method (described below). The Gauss-Newton method is preferable considering over an implementation on the ECU. The white arrows in FIG. 7 indicate obtaining the Ah by the optimum value search.

<Learned OCV Characteristic>

Next, a learned OCV characteristic is described.

Figure 8:
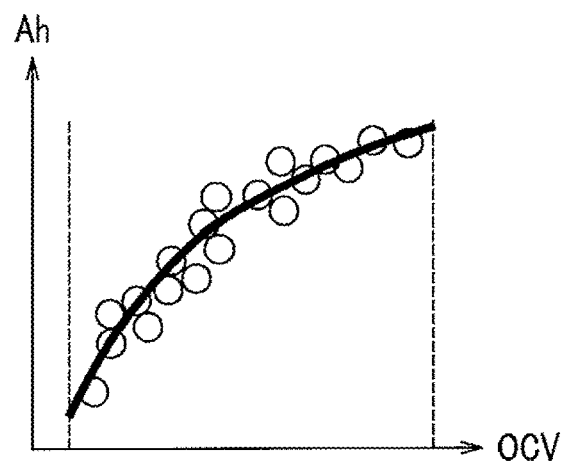
FIG. 8 is a graph showing an Ah-OCV curve illustrating a learned OCV characteristic in the battery-state estimating device according to the embodiment.

FIG. 8 is a diagram showing the Ah-OCV curve illustrating the learned OCV characteristic. FIG. 8 plots the Ah (electric quantity) on the vertical axis and the OCV (learned OCV) on the horizontal axis. A plurality of marks of circles (○) in FIG. 8 are a plurality of samples of the Ah and the OCV. In addition, the area between broken lines parallel to the vertical axis in FIG. 8 is a learning area.

The OCV function parameters described below are derived to calculate the Ah-OCV curve indicating the learned OCV characteristic shown in FIG. 8.

<Learned Battery Capacitance>

On the basis of the learned OCV characteristic, a learned battery capacitance can be obtained.

Figure 9:
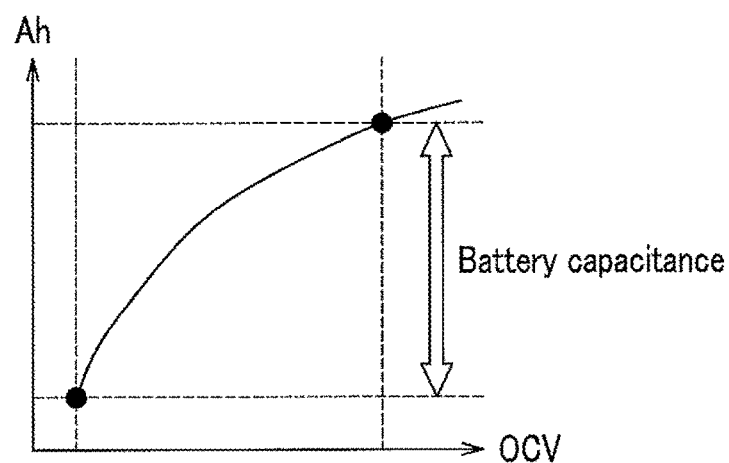
FIG. 9 is a graph showing an Ah-OCV curve illustrating a learned battery capacitance characteristic in the battery-state estimating device according to the embodiment.

FIG. 9 is a diagram showing the Ah-OCV curve describing the learned battery capacitance characteristic. FIG. 9 plots the Ah (electric quantity) on the vertical axis and the OCV (learned OCV) on the horizontal axis. A plurality of marks of circles (○) in FIG. 8 are a plurality of samples of the Ah and the OCV. And, the upper and lower use limit values of the OCV being set as indicated by the black circles (●) in FIG. 9 define an available capacitance between the two black circles.

As shown by the thick arrow in FIG. 9, the lower and upper limit values of the battery capacitance can be obtained on the basis of the learned OCV characteristic. These lower and upper limit values of the battery capacitance can be used to calculate the learned battery capacitance.

The learning method of the SOC-OCV curve is described in detail below.

[Learning Method of SOC-OCV Curve]

<Hypothetical Function of Learning Object>

First, a hypothetical function of a learning object is explained.

Figure 10:
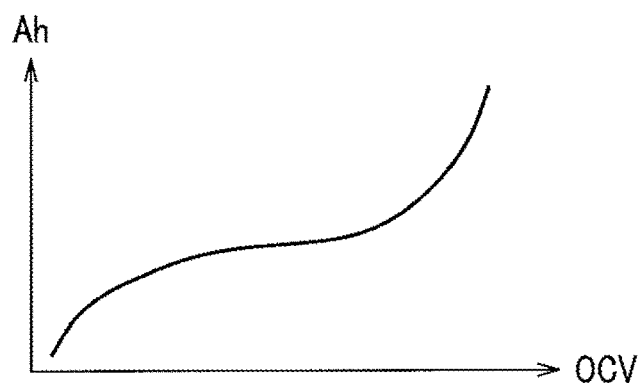
FIG. 10 is a graph showing an Ah-OCV curve illustrating a hypothetical function of learning object in the battery-state estimating device according to the embodiment.

FIG. 10 is a diagram showing an Ah-OCV curve for explaining a hypothetical function of a learning object. FIG. 10 plots the Ah (electric quantity) on the vertical axis and the OCV (estimated OCV) on the horizontal axis. The hypothetical function is used to estimate the SOC by calculation.

The Ah (electric quantity) is modeled by a quartic polynomial (model equation) shown in the following equation (8). Note that the model equation is not limited to the quartic polynomial shown in the equation (8), but that any model equation may be used as long as it is represented by a mathematical equation.

$$Ah = \theta_0 + \theta_1 OCV + \theta_2 OCV^2 + \theta_3 OCV^3 + \theta_4 OCV^4 \quad (8)$$

Note that $\theta_0$ to $\theta_4$ are parameters.

The ΔAh: difference value of Ah (electric quantity) is expressed by the following equation (9). And, the hypothetical function y is expressed by the following equation (10).

$$\Delta Ah = \theta_1(OCV_1 - OCV_2) + \theta_2(OCV_1^2 - OCV_2^2) + \theta_3(OCV_1^3 - OCV_2^3) + \theta_4(OCV_1^4 - OCV_2^4) \quad (9)$$

[Math. 2]

$$y = h_\theta(x) = \theta_1 x_1 + \theta_2 x_2 + \theta_3 x_3 + \theta_4 x_4 \quad (10)$$
$$= \sum_{i=1}^{4} \theta_i x_i = \theta^T x = h_\theta(x)$$

<Training Set (Learned Data)>

Next, the training set (learned data) stored in the data storage unit 151 of the map adjusting unit 150 is described.

The present embodiment obtains vehicle time series data for the training set (learned data). As shown in FIG. 6, the data storage unit 151 stores a set of OCV1 and OCV2 at respective time-points and corresponding ΔAh. Storing a set of the OCV1 and OCV2 at two points and ΔAh facilitates to associate kinds of data with each other and to apply the associated data on equations. The training set (learned data) is represented by the following equation (11), when the number of data sets is assumed to be m.

$$[OCV_1, OCV_2, \Delta Ah]$$

$$[OCV_1, OCV_2, \Delta Ah] \quad (11)$$

A result of applying the training set (learned data) described in the above equation (11) on the hypothetical function y of the above equation (10) is expressed by the following equation (12). Here, the number of data sets is assumed to be m.

$$[x_1, x_2, x_3, x_4, y] = [OCV_1 - OCV_2, OCV_1^2 - OCV_2^2, OCV_1^3 - OCV_2^3, OCV_1^4 - OCV_2^4, y] \quad (12)$$

<Cost Function>

Next, a cost function is explained.

The cost function is introduced in order to obtain a value of integrated errors.

The cost function J is represented by the following equation (13).

[Math. 3]

$$J = \frac{1}{2m}\sum_{i=1}^{m}(h_\theta(x^{(i)}) - y^{(i)})^2 \qquad (13)$$

The symbol (i) of the above equation (13) indicates that a calculation is performed for each of discrete grid points, which are expressed as i=1, 2, 3, - - - .

Searching such $\theta_j$ that makes a value of a partial differentiation of the cost function J with respect to θ closer to 0 allows to find the most precise $\theta_1$, $\theta_2$, $\theta_3$ - - - .

<Steepest Descent (Gradient Descent) Method>

Next, the steepest descent (gradient descent) method is explained.

As described above, the steepest descent (gradient descent) method is one of the optimum value searches, which the present embodiment uses for a calculation of the Ah-OCV curve by the supervised learning (learning under a supervisor).

The steepest descent (gradient descent) method represents the parameters $\theta_j$ as represented by the following equation (14).

[Math. 4]

$$\theta_j = \theta_j - \alpha \sum_{i=1}^{m}(h_\theta(x^{(i)}) - y^{(i)})x_j^{(i)} \qquad (14)$$

α: Learning rate (for every parameters (j))

A process of deriving the parameters $\theta_j$ shown in the above equation (14) is described.

Figure 11A:
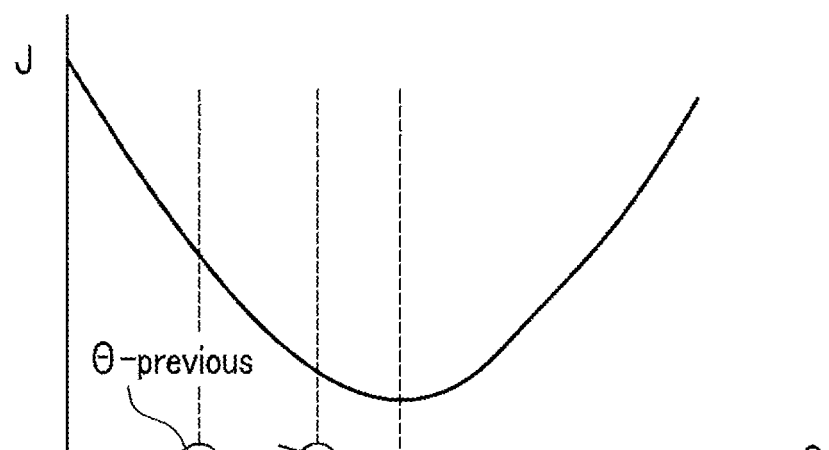
FIGS. 11A and 11B are graphs illustrating a derivation of a parameter $\theta_j$ by the battery-state estimating device according to the above embodiment.
Figure 11B:
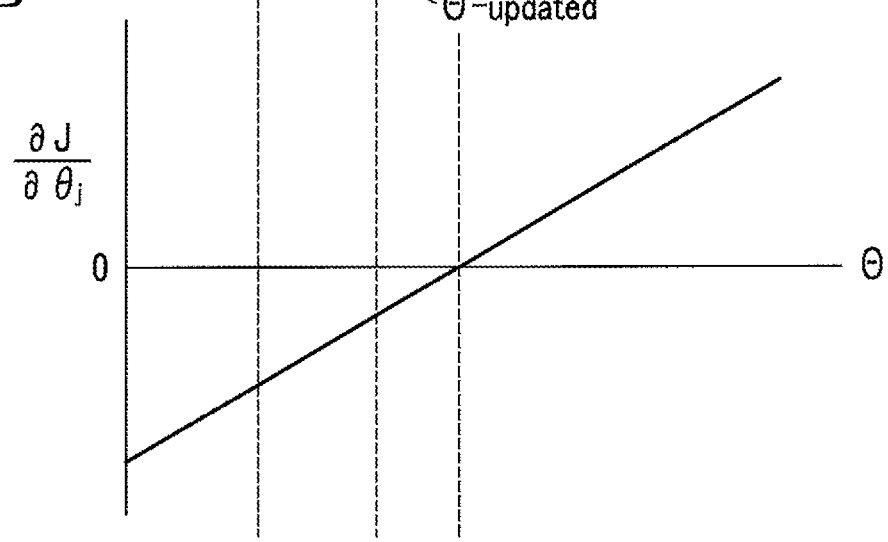

FIGS. 11A and 11B are graphs illustrating the derivation of the parameters $\theta_j$; FIG. 11A illustrates a relationship between the cost function J and the parameter θ; FIG. 11B illustrates a relationship between a partial differential (∂J/∂θ) of the cost function J with respect to θ and the parameter θ.

A calculation is performed for obtaining θ that minimizes the cost function J in the J-θ curve shown FIG. 11A; that is, θ that minimizes the cost function J in the above equation (13).

The partial differential (∂J/∂θ) of the cost function J is calculated with respect to θ. This partial differential (∂J/∂θ) is represented by the following equation (15).

[Math. 5]

$$\frac{\partial J}{\partial \theta} = \frac{1}{m}\sum_{i=1}^{m}(h_\theta(x^{(i)}) - y^{(i)})x^{(i)} \qquad (15)$$

A parameter update rule is represented by the following equation (16).

[Math. 6]

$$\theta_j = \theta_j - \alpha \frac{\partial J}{\partial \theta} \qquad (16)$$

$$\theta_j = \theta_j - \alpha \sum_{i=1}^{m}(h_\theta(x^{(i)}) - y^{(i)})x_j^{(i)} \quad \text{(Written again)} \qquad (14)$$

As shown in FIG. 11A, subtracting a multiplication of the above partial differential (∂J/∂θ) and a learning coefficient (learning rate) from a previous value of θ generates an update value of θ.

Introducing the above equation (15) to the right side of the equation (16) becomes the above equation (14).

Thereby, the parameters $\theta_j$ shown in the equation (14) are derived.

<Limiting Coefficients of Gradient and Approximate Equation>

The battery-state estimating device 100 automatically learns the Ah-OCV curve using the calculated Ah and OCV. The automatic learning of the Ah-OCV curve can be highly improved in its preciseness by introducing limits on gradients and coefficients of approximate equations.

Figure 12:
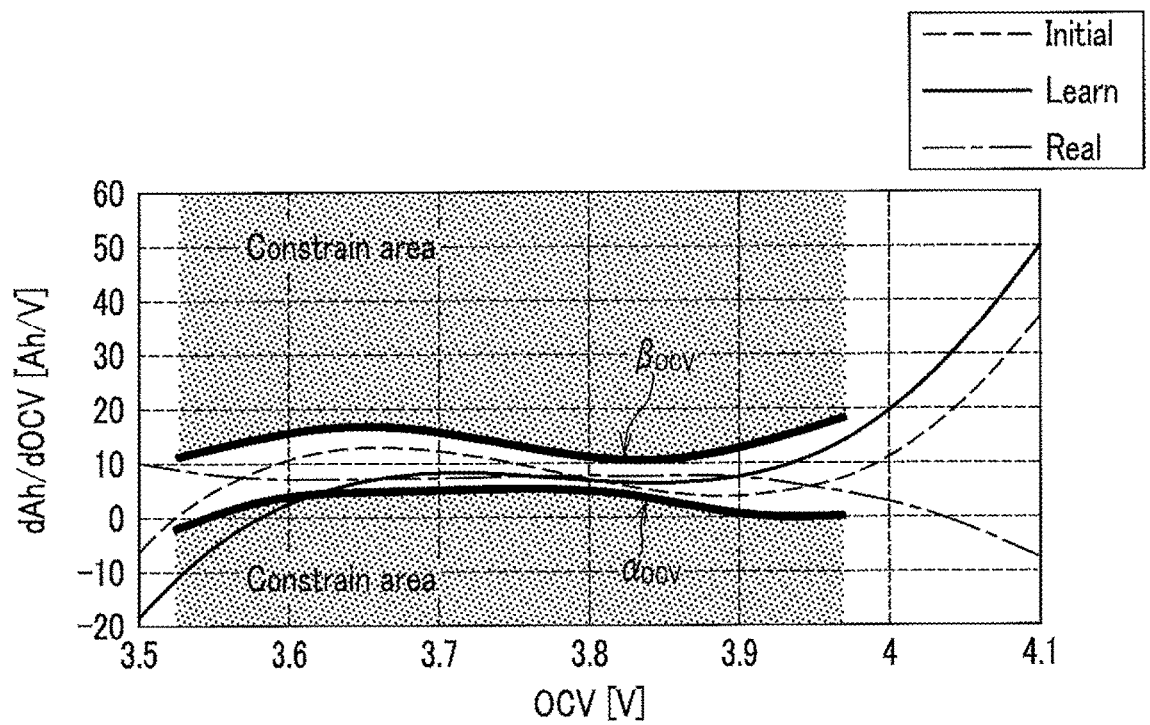
FIG. 12 is a graph showing a gradient value-OCV curve (dAh/dOCV-OCV curve) for illustrating limitations of the gradient and coefficients of the approximate equation in the battery-state estimating device according to the above embodiment.

FIG. 12 is a diagram showing the gradient-OCV curve (dAh/dOCV-OCV curve), used for explaining the limitation on the gradient and the approximate equation. FIG. 12 plots the gradient value (dAh/dOCV, unit: Ah/V) on the vertical axis, and the OCV (estimated OCV, unit: V) on the horizontal axis.

Among the curves in FIG. 12, the broken line expresses an initial curve ("Initial" in FIG. 12); the solid line a learned curve ("Learned" in FIG. 12); the one-dot chain line, a measured value curve ("Real" in FIG. 12).

Further, as shown in the shad in FIG. 12, the graph of FIG. 12 is provided with a limitation area for limiting the gradient and the coefficients of the approximate equation. This limitation area has a range of, for example, 3.5-4.0 V for the OCV.

Further, this limitation area limits an allowable range for the gradient value (dAh/dOCV) into a specified range, and introduces a lower boundary $\alpha_{ocv}$ and an upper boundary $\beta_{ocv}$ for the allowable range for the gradient value (dAh/dOCV). In FIG. 12, the lower one of the two thick solid line curves is the lower boundary $\alpha_{ovc}$; and the upper one is the upper boundary $\beta_{ocv}$. Among the initial curve (Initial), the learned curve (Learned), and the measured value curve (Real) in the example of FIG. 12, the learned curve (Learned) exceeds the lower boundary $\alpha_{ocv}$, and thus, should be limited to be within the lower boundary $\alpha_{ocv}$.

In practice, the model equation (see Equation (8)) is adjusted such that the learned curve does not exceed the lower boundary $\alpha_{ocv}$ and the upper boundary $\beta_{ocv}$, and thereby the learned curve is kept within the range between the lower boundary $\alpha_{ocv}$ and the upper boundary $\beta_{ocv}$.

An expression using an equation of a width between the lower boundary $\alpha_{ocv}$ and the upper boundary $\beta_{ocv}$ of the limitation area within which the gradient value (dAh/dOCV) can take is described in the following equation (17).

[Math. 7]

$$\alpha_{ocv_{BD}} \leq \left.\frac{dAh}{docv}\right|_{OCV_{BD}} \leq \beta_{ocv_{BD}} \qquad (17)$$

(Lower boundary)  (Upper boundary)

$$\left.\frac{dAh}{docv}\right|_{OCV_{BD}} = \theta_1 + 2\theta_2 ocv_{BD} + 3\theta_3 ocv_{BD}^2 + 4\theta_4 ocv_{BD}^3$$

As described above, the battery-state estimating device 100 includes a map adjusting unit 150, which predetermines the allowable range of the gradient value (dAh/dOCV) and adjusts the model equation shown in the equation (8) if the gradient value (dAh/dOCV) is out of the range predetermined. In the example of FIG. 12, the measured value curve (Real, one-dot chain line in FIG. 12) is required to be approximated by the learned curve (Learned, solid line in FIG. 12) to. In order to satisfy the above-described requirement, if no limitation of the lower boundary $\alpha_{ocv}$ and the upper boundary $\beta_{ocv}$ is introduced on a width within which the gradient value (dAh/dOCV) can take, a quantity of calculation for adjusting the model equation becomes enormous, resulting in an incompleteness of the computation or lower calculation preciseness.

Introducing the lower boundary $\alpha_{ocv}$ and the upper boundary $\beta_{ocv}$ to the allowable width within which the gradient value (dAh/dOCV) can take enables to improve the calculation preciseness.

Limiting in advance the range of the gradient value on the basis of the specifications of the secondary battery 1 (see FIG. 1) allows the gradient value (dAh/dOCV) out of the predetermined range thereof to be adjusted by the map adjusting unit 150 to precisely estimate the state-of-charge of the secondary battery 1.

<Construction of Machine Learning Device with Constraint Implemented>

Now, a construction of the machine learning unit with constraints implemented is described.

Putting constraints on learning allows reducing the quantity of calculation and improve the preciseness of the calculation.

The constraints (see FIG. 12 and the equation (17)) upon learning may be implemented on the learning by reflecting the constraints into the cost function (see the equation (13))

The cost function J with no constraint condition is represented by the equation (13).

<Cost Function with Constraint Implemented>

The cost function J with the constraint implemented is represented by the following equation (18). The cost function J with the constraint implemented may be expressed by adding the constraint to the cost function J with no constraints (equation (13)). The constraints in the present embodiment are, for example, a weight function $\mu$ and a penalty function $P_\theta$. Note that the learning method with constraints includes a Barrier function as well as the Penalty function.

[Math. 8]

$$J = \frac{1}{2m}\sum_{i=1}^{m}(h_\theta(x^{(i)}) - y^{(i)})^2 + \mu P_\theta \qquad (18)$$

In the right side of the equation (18), a variable "$\mu$" is a Weight function; $P_\theta$ a Penalty function.

<Penalty Function>

When a constraint is set as $g_j(\theta) \leq 0$, provided with J= (1, . . . , n), the Penalty function $P_\theta$ is represented by the following equation (19).

[Math. 9]

$$\text{Constraints: } g_j(\theta) \leq 0 \quad j=(1,\ldots,n) \qquad (19)$$

-continued $$P_\theta = \frac{1}{n}\sum_{k=1}^{n}\max(g_k(\theta), 0) \quad n\text{: number of constraints}$$

$$\max(g_k(\theta), 0) = \begin{cases} 0 & (g_k(\theta) \leq 0)\text{: Constraint is satisfied} \\ g_k(\theta) & (g_k(\theta) > 0)\text{: Constraint is unsatisfied} \end{cases}$$

<Constrained Steepest Descent (Gradient Descent) Method>

Next, a constrained steepest descent (gradient descent) method is described. The parameter $\theta_j$ obtained by the steepest descent (gradient descent) method can be also added with the constraints, which is represented by a weight function $\mu$. The parameter $\theta_j$ obtained by the steepest descent method is represented by the following equation (20).

[Math. 10]

$$\theta_j = \theta_j - \alpha\left(\frac{1}{m}\sum_{i=1}^{m}(h_\theta(x^{(i)}) - y^{(i)})x_j^{(i)} + \mu\frac{1}{n}\sum_{k=1}^{n}\frac{\partial P(\theta)^{(k)}}{\partial \theta_j^{(k)}}\right) \qquad (20)$$

$\alpha$: Learning rate (for every parameters (j))

In the equation (20), "$\alpha$" is a learning coefficient (learning rate).

Updating the above equation (20) is performed until the parameter (the cost function) converges.

<Constraint for Lower Boundary>

The above-mentioned lower and upper boundaries, $\alpha_{ocv}$ and $\beta_{ocv}$ for the gradient value (dAh/dOCV)) may be added with the constraint (see FIG. 12 and the equation (17)).

First, a description is made of the constraint for the lower boundary.

The constraint for the lower boundary $g_{OCV\_BD}$ is represented by the following equations (21) to (23).

[Math. 11]

$$g_{OCV_{BD}}(\theta) = -\theta_1 - 2\theta_2 ocv_{BD} - 3\theta_3 ocv_{BD}^2 - 4\theta_4 ocv_{BD}^3 + \alpha_{ocv_{BD}} \leq 0 \qquad (21)$$

$$\frac{\partial P_\theta}{\partial \theta} = \frac{\partial}{\partial \theta}\sum_{k=1}^{n}\max(g_k(\theta), 0) \qquad (22)$$

$$\frac{\partial P_\theta}{\partial \theta} = \begin{cases} \begin{bmatrix} 0 \\ 0 \\ 0 \\ 0 \end{bmatrix} & (g_j(\theta) \leq 0) \\ \begin{bmatrix} -1 \\ -2ocv_{BD} \\ -3ocv_{BD}^2 \\ -4ocv_{BD}^3 \end{bmatrix} & (g_j(\theta) > 0) \end{cases} \qquad (23)$$

The four terms in the left side of the above equation (21): "$-\theta - 2\theta_2 OCV_{BD} - 3\theta_3 OCV_{BD}^2 - 4\theta_4 OCV_{BD}^3$" is the constraint for the lower boundary $\alpha_{OCV\_BD}$. In addition, the above equation (22) is a conditional equation generated by partially differentiating the penalty function $P_\theta$ with respect to the parameter $\theta(\partial P_\theta/\partial \theta)$; and the above equation (23) is a matrix representation of the equation (22) in a case of the parameter $\theta$ being defined as four parameters $\theta_1$ to $\theta_4$.

<Constraint for Upper Boundary>

Similarly, the upper boundary, $\beta_{ocv}$ for the gradient value (dAh/dOCV)) may be added with a constraint (see FIG. 12 and the equation (17)).

The constraint, $g_{OCV\_BD}$ for the upper boundary, $\beta_{ocv}$ is represented by the following equation (24) to (26).

[Math. 12]

$$g(\theta) = \theta_1 + 2\theta_2 ocv_{BD} + 3\theta_3 ocv_{BD}^2 + 4\theta_4 ocv_{BD}^3 - \beta_{ocv_{BD}} \leq 0 \quad (24)$$

$$\frac{\partial P_\theta}{\partial \theta} = \frac{\partial}{\partial \theta} \sum_{k=1}^n \max(g_k(\theta), 0) \quad (25)$$

$$\frac{\partial P_\theta}{\partial \theta} = \begin{cases} \begin{bmatrix} 0 \\ 0 \\ 0 \\ 0 \end{bmatrix} & (g_j(\theta) \leq 0) \\ \begin{bmatrix} 1 \\ 2ocv_{BD} \\ 3ocv_{BD}^2 \\ 4ocv_{BD}^3 \end{bmatrix} & (g_j(\theta) > 0) \end{cases} \quad (26)$$

The four terms in the left side of the above equation (24): "$\theta_1 + 2\theta_2 OCV_{BD} + 3\theta_3 OCV_{BD}^2 + 4\theta_4 OCV_{BD}^3$" is the constraint for the upper boundary $\beta_{OCV\_BD}$. In addition, the above equation (25) is a conditional equation generated by partially differentiating the penalty function $P_\theta$ with respect to the parameter $\theta(\partial P_\theta/\partial \theta)$; and the above equation (26) is a determinant of the equation (25) in a case of the parameter $\theta$ being defined as four parameters $\theta_1$ to $\theta_4$.

<Constraint to Allowable Range of Gradient Value (dAh/dOCV) with Specified Range>

Next is explained a constraint to an allowable range of the gradient value (dAh/dOCV) with a specified range.

Figure 13:
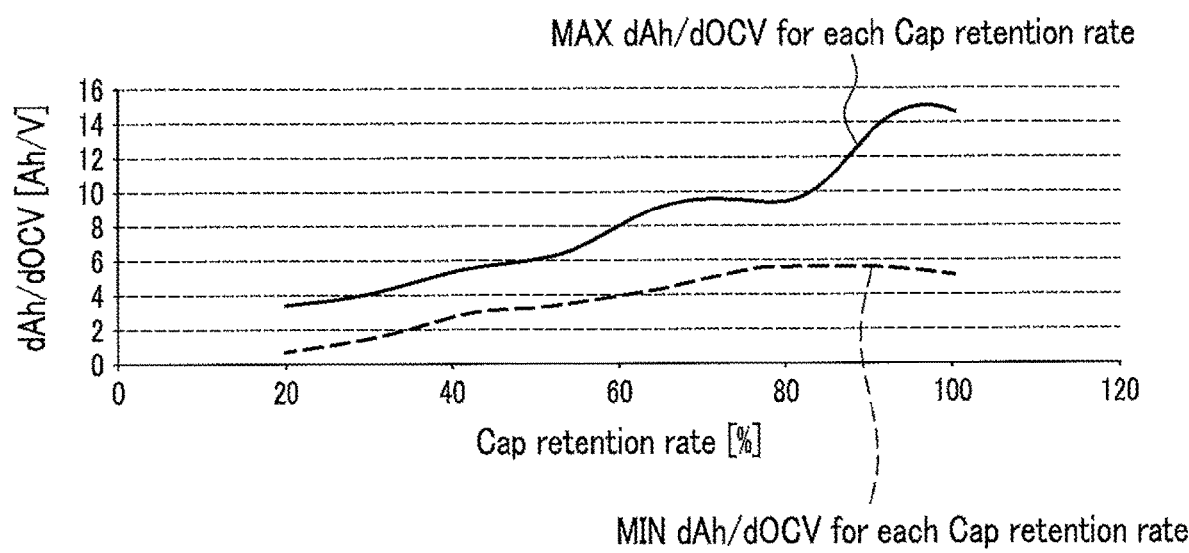
FIG. 13 is a graph showing a relationship between the gradient value (dAh/dOCV) and capacitance retention rate in the battery-state estimating device according to the above embodiment.
Figure 14:
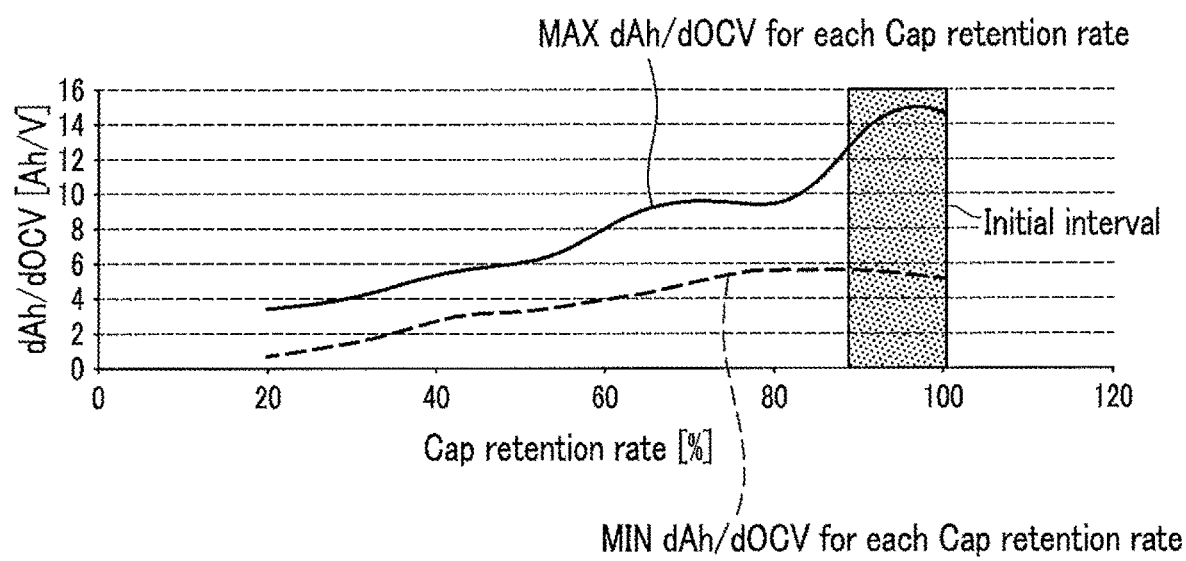
FIG. 14 is a graph showing a relationship between the gradient value (dAh/dOCV) and the capacitance retention rate in the battery-state estimating device according to the above embodiment.
Figure 15:
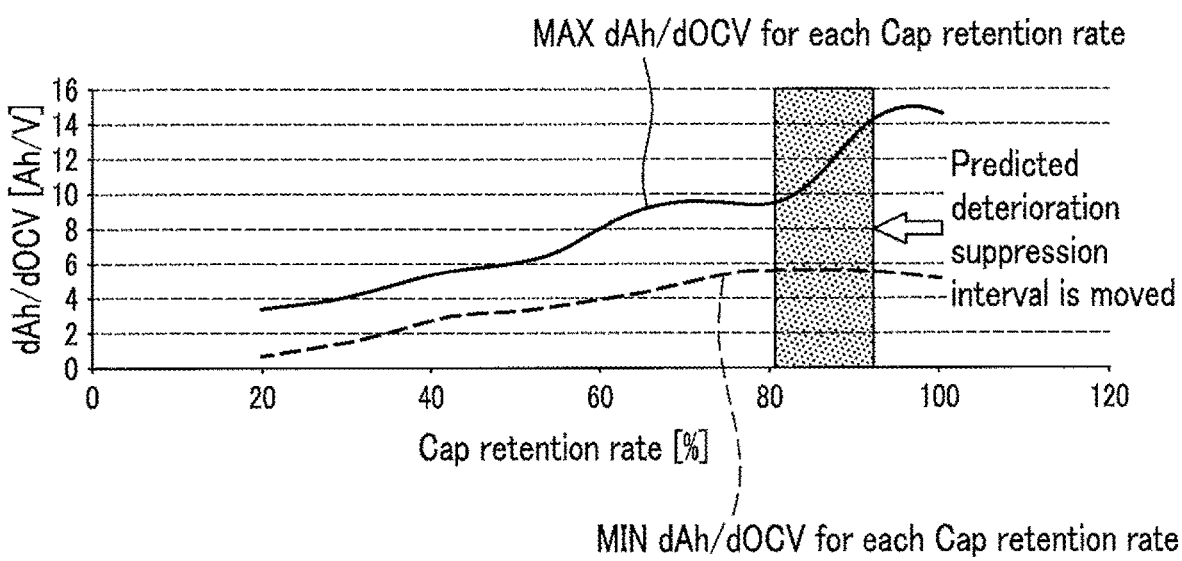
FIG. 15 is a graph showing a relationship between the gradient value (dAh/dOCV) and the capacitance retention rate in the battery-state estimating device according to the above embodiment.

FIGS. 13 to 15 are graphs showing a relationship between the gradient value (dAh/dOCV) and the capacitance retention rate. FIGS. 13 to 15 plot the gradient value (dAh/dOCV, unit: Ah/V) on the vertical axis, and the capacitance retention ratio (unit: %) on the horizontal axis.

In FIGS. 13 to 15, the graphs shown in solid lines are graphs of a maximum value (MAX value) of the gradient values (dAh/dOCV) for each capacitance retention rate; the graphs shown in broken lines, a minimum value (MIN value) of the gradient values (dAh/dOCV) for each capacitance retention rate. For these MAX value and MIN value, a production variation such as a difference in N/P ratio and a difference in a standing-cycle are taken into account in advance.

As shown in FIG. 13, when the capacitance retention rate is 100 [%] (when there is no deterioration of the battery), the allowable width between the MAX value and the MIN value of the gradient values (dAh/dOCV) is the greatest. In this case, the gradient value (dAh/dOCV) is rarely out of the specified range. If the gradient value (dAh/dOCV)) is within the specified range, the map adjusting unit 150 (see FIG. 1) does not perform adjusting of the model equation shown in the above equation (8). On the other hand, when the capacitance retention rate is 20 [%] (when the deterioration of the battery has proceeded), the allowable range between the MAX value and the MIN value of the gradient values (dAh/dOCV) are small. In this case, the gradient value (dAh/dOCV) is predicted to frequently deviate from the specified range. If the gradient value (dAh/dOCV) deviates from the specified range, the map adjusting unit 150 (see FIG. 1) adjusts the model equation shown in the equation (8). The battery-state estimating device 100 may precisely estimate the state-of-charge of the secondary battery 1 (FIG. 1) by adjusting the gradient values (dAh/dOCV) deviating from the specified range with the map adjusting unit 150.

A shaded portion shown in FIG. 14 shows the deterioration suppression interval for putting the gradient value (dAh/dOCV) in the specified range. This deterioration suppression interval is used for determining whether or not the gradient value (dAh/dOCV) is out of the specified range. In an initial time of usage of the secondary battery 1, the deterioration suppression interval is set at a range in which the capacitance retention ratio is near 100 [%], i.e., the secondary battery 1 is not deteriorated (the shaded portion in FIG. 14). In FIG. 14, the deterioration suppression interval is set at a range of 100 [%]-90 [%] of the capacitance retention rate.

FIG. 15 shows an example in which the capacitance retention rate calculated is, for example, 86%. If a battery service life has elapsed or a battery deterioration has occurred, the deterioration suppression interval is moved to a range in which the capacitance retention ratio is lower, for example, in FIG. 15, a range in which the capacitance retention rate ranges 92-80 [%], i.e., a shaded portion directed by a white arrow in FIG. 15.

Optimizing an range of the model equation adjusted by the map adjusting unit 150 in accordance with the battery deterioration state or the like enables a precise estimation of the state-of-charge of the secondary battery 1 (see FIG. 1).

The above-mentioned estimation of the state-of-charge of the secondary battery 1 is performed for each temperature of the secondary battery 1.

In the present embodiment, for the values adopted for the deterioration suppression interval, a test performed in advance determines the maximum value and the minimum value. In addition, the maximum/minimum values of the gradient value (dAh/dOCV) and the coefficient μ of the approximate equation are prepared in a fashion in which the capacitance retention rate ranges over certain degree of width, to be selected in consideration of a deterioration rate of the secondary battery 1.

Although the above example describes about a control of the gradient value (dAh/dOCV), the coefficient μ of the approximate equation can be used for the estimation of the state-of-charge of the secondary battery 1 in a similar manner. The estimation using the coefficient μ also provides the same effect as the estimation using the gradient value (dAh/dOCV).

Next is a description of an operation of the battery-state estimating device 100.

Figure 16A:
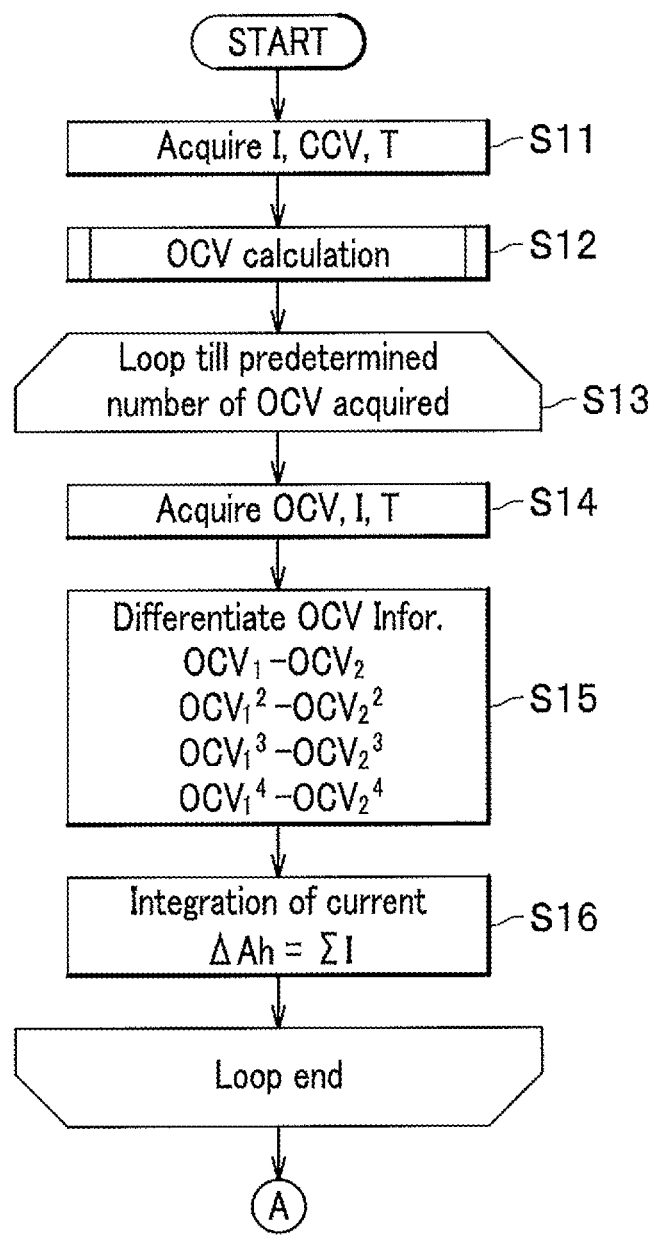
FIGS. 16A and 16B show a flowchart of a method for estimating the battery state executed by the battery-state estimating device according to the embodiment.
Figure 16B:
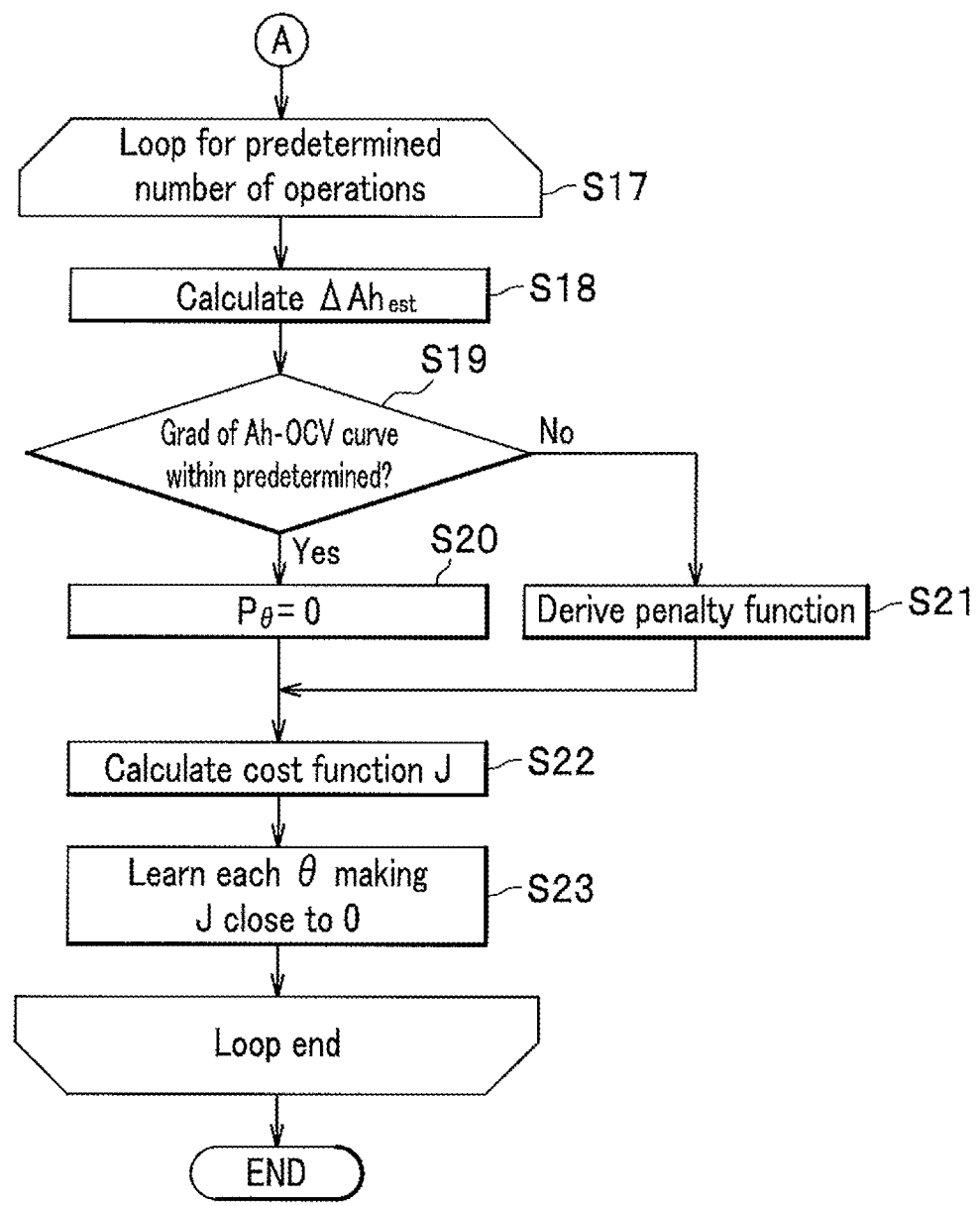

FIGS. 16A and 16B show a flowchart of a process of the battery-state estimating method executed by the battery-state estimating device 100 (see FIG. 1).

First, at step S11, each of the detecting units acquires current information I, voltage information CCV, and temperature information T. That is, the current detecting unit 101 acquires the current information I; the voltage detecting unit 102 acquires the voltage information CCV; the temperature detecting unit 103 acquires the temperature information T.

At step S12, the OCV calculating unit 120 calculates the OCV (estimated OCV) from the detected values (current I, inter-terminal voltage CCV) and the calculated resistance, according to the above-described equation (2).

At an end of a loop starting with step S13, the charge state estimating unit 130 repeats the loop until a predetermined number of OCVs are obtained in a range of applicable SOC. That is, steps from S14 to S16 are repeated between the loop start at the step S13 and the end of the loop, until a predetermined number of OCVs are obtained in the range of the applicable SOC. In this loop process, data used for generating an SOC curve of the battery are collected.

At step S14, the charge state estimating unit 130 acquires the calculated OCV (the estimated OCV), the current information I, and the temperature information T.

At step S15, the charge state estimating unit 130 performs a differentiation on the battery OCV information. Here, the charge state estimating unit 130 calculates differences of the battery OCV information: $(OCV_1-OCV_2)$, $(OCV_1^2-OCV_2^2)$, $(OCV_1^3-OCV_2^3)$, $(OCV_1^4-OCV_2^4)$.

At step S16, the charge state estimating unit 130 performs an integration of current information of the battery: $\Delta Ah = \Sigma I$, which calculates $\Delta Ah$ (change of integrated current value).

At an end of a loop starting with step S17, the charge state estimating unit 130 repeats the loop until a predetermined number of operations are processed. That is, steps from S18 to S23 are repeated between the loop start at the step S17 and the loop end, until a predetermined number of operations are processed.

At step S18, the charge state estimating unit 130, in accordance with an assumed curve and on the basis of the OCV difference information obtained by the battery OCV difference information (step S15), calculates $\Delta Ah$ according to the above equation (9).

At step S19, the gradient deriving unit 152 determines whether or not the gradient of the Ah-OCV curve 131 (see FIG. 2) is within the predetermined value range.

If the gradient of the Ah-OCV curve is within the predetermined value range ("Yes" at step S19), the penalty function is not applied, that is, at step S20, the gradient deriving unit 152 derives the penalty function "$P_\theta=0$" and proceeds to step S22.

If the gradient of the Ah-OCV curve is out of the predetermined value range ("No" at step S19), in order to put the Ah-OCV curve within the predetermined value range, at step S21, the gradient deriving unit 152 derives the penalty function represented by the following equation (27)-(29) and proceeds to step S22.

[Math. 13]

$$lg_{OCV}^{(i)} = -\theta_1 - 2\theta_2 OCV^{(i)} - 3\theta_3 OCV^{(i)2} - 4\theta_4 OCV^{(i)3} + \alpha_{ocv} \quad (27)$$

$$ug_{OCV}^{(i)} = \theta_1 + 2\theta_2 OCV^{(i)} + 3\theta_3 OCV^{(i)2} + 4\theta_4 OCV^{(i)3} + \beta_{ocv} \quad (28)$$

$$P_\theta = \frac{1}{n}\sum_{i=1}^{n}(lg_{OCV}^{(i)} + ug_{OCV}^{(i)}) \quad (29)$$

The symbols $lg_{OCV}^{(i)}$ and $ug_{OCV}^{(i)}$ of the above equation (27) to (29) denote functions "g" relating to the OCV, with "(i)" indicating a term for each grid point. Further, the symbol "l" indicates that the function "lg" is a lower side function and the symbol "u" indicates that the function "ug" is an upper side function.

The function $lg_{OCV}^{(i)}$ of the above equation (27) introduces the lower boundary $\alpha_{ocv}$ of the above-mentioned gradient value (dAh/dOCV); and, the function $ug_{OCV}^{(i)}$ of the above equation (28) introduces the upper boundary $\beta_{ocv}$ of the above-mentioned gradient value (dAh/dOCV).

At step S22, the map adjusting unit 150 calculates the cost function J according to the above equation (18).

At step S23, the map adjusting unit 150 performs a partial differentiation of the cost function J and learning with respect to each θ such that a value of each partial differentiation approaches 0 according to the above equation (16).

The process of the present flowchart is completed when a predetermined number of operations are in the above loop is executed.

As described above, the battery-state estimating device 100 according to the present embodiment (see FIG. 1) includes the OCV calculating unit 120 calculating the OCV from the detected values, the charge state estimating unit 130 deriving the charge state parameters on the basis of the calculated OCV and Ah (charge state parameter)-OCV map 131, the map adjusting unit 150 adjusting the Ah-OCV map 131 (see FIG. 2), wherein the map adjusting unit 150, on the basis of a first OCV calculated by the OCV calculating unit 120 at a first time-point; a second OCV calculated by the OCV calculating unit 120 at a second time-point; and the difference between the integrated current values generated by current flowing through the secondary battery 1 during the first and second time-points, derives a model equation of the Ah-OCV map 131 (see the equation (8)), and adjusts the Ah-OCV map 131 using the model equation.

The battery-state estimating method according to the present embodiment includes: the OCV calculating step of calculating the OCV from the detected current and voltage of the secondary battery 1 and the internal resistance at the times of charge and discharge; the charge state estimating step of deriving the charge state parameters on the basis of the calculated OCV and Ah-OCV map 131; and a map adjusting step of adjusting the Ah-OCV map 131, wherein the map adjusting step, on the basis of the first OCV calculated by the OCV calculating step at the first time-point; the second OCV calculated by the OCV calculating step at the second time-point; and the difference between the integrated current values generated by current flowing through the secondary battery 1 during the first and second time-points, derives a model equation of the Ah-OCV map 131 and adjusts the Ah-OCV map 131 using the model equation.

The above mentioned device 100 enables calculation of the SOC and the capacitance in consideration of a variation due to the production variation and deterioration of the SOC-OCV curve and using up more inherent capability of the battery. Such a device may provide an effect of improving the vehicle performance at a degree corresponding to the improved preciseness of estimation of the state-of-charge of the battery, or another effect of reducing more cost by more reduction of the number of cells and the like corresponding to the improved performance.

Further, as a unique advantageous effect, the battery-state estimating device 100 according to the present embodiment is able to acquire and operate data to estimate the state-of-charge of the secondary battery 1 at each time needed even during traveling of a vehicle, and thus, able to perform the estimate in consideration of the deterioration state of the battery (it is effective because the deterioration state varies by every user), and in addition, receive no influence due to the individual differences.

Furthermore, the battery-state estimating device 100 according to the present embodiment does not require a plurality of maps of the SOC-OCV curves different from each other according to the deterioration state, the individual differences, and the temperature unlike the device described in Patent Document 1, and thus is able to achieve both of reduction of storage capacity and precise estimate of the battery state. Further, the device 100 according to the present embodiment may estimate the battery state in a situation that the deterioration state, the individual differences, and the temperature are not able to be assumed. This allows a calculation of the SOC and the capacitance in consideration of a variation due to the production variation and deterioration of the SOC-OCV curve; and using up more inherent capability of the battery. This provides an effect of improving the vehicle performance at a degree corresponding to the improved preciseness of estimation of the state-of-charge of the battery, or another effect of reducing more cost by more reduction of the number of cells and the like corresponding to the improved performance.

Furthermore, the battery-state estimating device 100 according to the present embodiment does not assume the hysteresis unlike the device described in Patent Document 2, and thus, allows the estimation of the SOC-OCV curve even without the hysteresis. In addition, the map for controlling the upper and lower limit values is configured only for conditions of the gradient and the coefficients, and thus, any deterioration condition and individual variations can be supported.

Furthermore, the present embodiment, when learning the SOC-OCV curve from the SOC value and the OCV value calculated by the controller, introduces limits on the gradient of the SOC-OCV curve and the coefficients of the equations for learning the SOC-OCV curve. These limits range over a width that depends on the capacitance retention rate. Such limits are able to improve learning preciseness.

In the present embodiment, as described above, for the values adopted for the limitation, a test performed in advance determines the maximum value and the minimum value. In addition, the maximum/minimum values of the gradient and the coefficient of the approximate equation are prepared in a fashion in which the capacitance retention rate ranges over certain degree of width, such as to be selected in consideration of a deterioration rate of the secondary battery 1. The width of the capacitance retention rate may be estimated using data stored in a recorder, such as a time period and histogram data of the temperature and the SOC.

The present invention is not intended to be limited to the embodiment described above, but includes other modifications and application examples as long as they do not depart from the gist of the present invention described in the claims.

For example, a method, a device, and a program for estimating a battery state, may be implemented by a separate hardware that has only a calculation function, or a software in a battery system, and thus, operation of the method, device, and program for estimating a battery state may be implemented by an ASIC (Application Specific Integrated Circuit) and the like, as well as a computer program.

In addition, the examples of the embodiment described above are described in detail in order to illustrate the invention for better understanding and are not necessarily intended to be limited to those having the all described configurations. Further, a part of configuration of one of the examples of the embodiment may be replaced by a configuration of another example of the embodiment, and a configuration of one of the examples may be added to a configuration of another e example. Furthermore, a part of the configuration of each example may be added to, deleted, or replaced with another part of configuration of another example.

Further, each of the above configurations, functions, processing units, processing means, may be implemented partially or wholly by hardware designed on, for example, an integrated circuit. In addition, each of the above configurations, functions as shown in FIG. 1 and FIG. 6 may be implemented by software that makes a processor interpret and execute a program implementing the respective functions. A program for implementing each function and information recorded in a table, file, and the like may be stored in a storage device such as a memory, a hard disk, and a SSD (Solid State Drive), or a record media such as an IC (Integrated Circuit) card, an SD (Secure Digital) card, an optical disk. In yet addition, in the present specification, a process describing time-series steps may include a process that is executed sequentially in time-base according to the described order, but also a process that can be executed in parallel or individually at a discrete time (for example, parallel processing or object processing).

Furthermore, the present specification displays control lines and information lines considered to be needed for explaining the embodiment, and not all control lines and information lines necessary for a design of an actual product. Actual products may be considered that almost all configurations are mutually connected.

REFERENCE SIGN

100: battery-state estimating device
101: current detecting unit
102: voltage detecting unit
103: temperature detecting unit
110: resistance calculating unit
120: OCV calculating unit
130: charge state estimating unit
131: Ah-OCV map (charge state parameter-OCV map)
140: capacitance calculating unit
150: map adjusting unit
151: data storage unit
152: gradient deriving unit

We claim:

1. A device for estimating a battery state, comprising:
a current detecting unit configured to detect a charge/discharge current of a battery;
a voltage detecting unit configured to detect an inter-terminal voltage of the battery;
an OCV calculating unit configured to calculate an OCV (Open Circuit Voltage) on a basis of the charge/discharge current detected and the inter-terminal voltage detected of the battery and an internal resistance of the battery at times of charge and discharge;
a charge state estimating unit configured to derive a charge state parameter on a basis of the OCV calculated and a charge state parameter-OCV map;
and a map adjusting unit configured to adjust the charge state parameter-OCV map, wherein
the map adjusting unit is configured to:
derive a model equation for the charge state parameter-OCV map on a basis of a combination of a first OCV calculated by the OCV calculating unit at a first time-point, a second OCV calculated by the OCV calculating unit at a second time-point, and a difference between integrated current values, the difference generated by current flowing through the battery during the first time-point and the second time-point;
adjust the charge state parameter-OCV map using the model equation derived;
include a gradient deriving unit configured to derive a gradient indicating a variation of the OCV with respect to the charge state parameter as a gradient value;
pre-determine a value range which the gradient may take; and adjust the model equation when the gradient derived by the gradient deriving unit is out of the value range pre-determined.

2. The device for estimating a battery state according to claim 1, wherein
the map adjusting unit is configured to:
include a storage unit configured to store one or more combinations of the first OCV, the second OCV, and the difference between the integrated current values; and
retrieve the one or more combinations of the first OCV, the second OCV, and the difference between the integrated current values to adjust the charge state parameter-OCV map.

3. The device for estimating a battery state according to claim 2, wherein the gradient deriving unit changes the value range over which the gradient value can take, in accordance to a deterioration state of the battery.

4. The device for estimating a battery state according to claim 1,
further comprising a battery temperature detecting unit configured to detect a temperature of the battery, wherein
the map adjusting unit adjusts the charge state parameter-OCV map for each of the detected temperature of the battery.

5. A method for estimating a battery state, comprising:
a current detecting step of detecting a charge/discharge current of a battery;
a voltage detecting step of detecting an inter-terminal voltage of the battery;
an OCV calculating step of calculating an OCV (Open Circuit Voltage) on a basis of the charge/discharge current detected and the inter-terminal voltage of the battery detected and an internal resistance of the battery at a time of charge and discharge;
a charge state estimating step of deriving a charge state parameter on a basis of the OCV calculated and a charge state parameter-OCV map;
and a map adjusting step of adjusting the charge state parameter-OCV map, wherein
the map adjusting step includes:
deriving a model equation for the charge state parameter-OCV map on a basis of a set of a first OCV calculated by the OCV calculating step at a first time-point, a second OCV calculated by the OCV calculating step at a second time-point, and a difference between integrated current values, the difference generated by current flowing through the battery during the first time-point and the second time-point;
adjusting the charge state parameter-OCV map using the model equation;
deriving a gradient indicating a variation of the OCV with respect to the charge state parameter as a gradient value;
making a pre-determination of a value range which the gradient may take; and
adjusting the model equation when the gradient derived by the deriving step is out of the value range pre-determined.

* * * * *